United States Patent
Feng et al.

(10) Patent No.: US 11,777,533 B2
(45) Date of Patent: Oct. 3, 2023

(54) METHOD FOR POLAR DECODING WITH DYNAMIC SUCCESSIVE CANCELLATION LIST SIZE AND POLAR DECODER

(71) Applicant: Telefonaktiebolaget LM Ericsson (publ), Stockholm (SE)

(72) Inventors: Ang Feng, Beijing (CN); Ailing Xie, Beijing (CN); Yushi Zhang, Beijing (CN)

(73) Assignee: Telefonaktiebolagget LM Ericsson (Publ), Stockholm (SE)

( * ) Notice: Subject to any disclaimer, the term of this patent is extended or adjusted under 35 U.S.C. 154(b) by 0 days.

(21) Appl. No.: 17/297,012

(22) PCT Filed: Nov. 27, 2018

(86) PCT No.: PCT/CN2018/117716
§ 371 (c)(1),
(2) Date: May 26, 2021

(87) PCT Pub. No.: WO2020/107218
PCT Pub. Date: Jun. 4, 2020

(65) Prior Publication Data
US 2021/0399747 A1    Dec. 23, 2021

(51) Int. Cl.
*H03M 13/00* (2006.01)
*H03M 13/09* (2006.01)
(Continued)

(52) U.S. Cl.
CPC ....... *H03M 13/6572* (2013.01); *H03M 13/09* (2013.01); *H03M 13/1111* (2013.01); *H03M 13/3927* (2013.01); *H03M 13/4161* (2013.01)

(58) Field of Classification Search
None
See application file for complete search history.

(56) References Cited

U.S. PATENT DOCUMENTS 10,615,825 B2 * 4/2020 Sarkis ............... H03M 13/13
10,831,231 B1 * 11/2020 Old ......................... G06F 7/52
(Continued)

FOREIGN PATENT DOCUMENTS

| CN | 105933010 A | 9/2016 |
|---|---|---|
| CN | 106209113 A | 12/2016 |

(Continued)

OTHER PUBLICATIONS

International Search Report and the Written Opinion of the International Searching Authority, issued in corresponding International Application No. PCT/CN2018/117716, dated Aug. 27, 2019, 11 pages.
(Continued)

*Primary Examiner* — Mujtaba M Chaudry
(74) *Attorney, Agent, or Firm* — Christopher & Weisberg, P.A.

(57) ABSTRACT

It provides a method (300) for polar decoding a received signal into a number, N, of bits with Successive Cancellation List, SCL. The method (300) includes: at the i-th level of a binary tree for decoding the i-th bit of the N bits, where $1 \leq i \leq N$: when the i-th bit is an information bit, calculating (310) a path metric for each of $2*L_{i-1}$ candidate paths at the i-th level, where $L_{i-1}$ is an SCL size at the (i−1)-th level and $L_0=1$; setting (320) an SCL size at the i-th level, $L_i$, based on $L_{i-1}$ and a statistical distribution of the path metrics calculated for the $2*L_{i-1}$ candidate paths; and selecting (330) $L_i$ surviving paths from the $2*L_{i-1}$ candidate paths based on their respective path metrics.

9 Claims, 6 Drawing Sheets

(51) Int. Cl.
H03M 13/11 (2006.01)
H03M 13/39 (2006.01)
H03M 13/41 (2006.01)

(56) References Cited

U.S. PATENT DOCUMENTS

2017/0149531 A1* 5/2017 Raza ............... H03M 13/13
2018/0270017 A1* 9/2018 Lin ............... H04L 1/0058

FOREIGN PATENT DOCUMENTS

| CN | 106877884 A | 6/2017 |
|---|---|---|
| CN | 107302372 A | 10/2017 |
| WO | 2018161274 A1 | 9/2018 |

OTHER PUBLICATIONS

ARIKAN "Channel polarization: A method for constructing capacity-achieving codes for symmetric binary-input memoryless channels" http://arxiv.org/abs/0807.3917v1, Jul. 24, 2008, 44 pages.
BIOGLIO "Design of Polar Codes in 5G New Radio" http://arxiv.org/abs/1804.04389v1, Apr. 12, 2018, 9 pages.
Li et al. "An Adaptive Successive Cancellation List Decoder for Polar Codes with Cyclic Redundancy Check," in IEEE Communications Letters, vol. 16, No. 12, pp. 2044-2047, Dec. 2012, doi: 10.1109/LCOMM.2012.111612.121898.
EPO Communication with Supplementary European Report dated May 17, 2022 for Patent Application No. 18941877.5, consisting of 11—pages.
3GPP TSG RAN WG1 94 Meeting R1-1809491; Title: A comparison of polar and LDPC codes for URLLC; Agenda Item: 7.1.8; Source: Polaran; Document for: Information; Date and Location: Aug. 20-24, 2018, Gothenburg, Sweden, consisting of 7—pages.
Carlo Condo et al.; Design and Implementation of a Polar Codes Blind Detection Scheme; Arxiv.org; Jan. 4, 2018, consisting of 8—pages.
A. Balatsoukas-Stimming et al.; LLR-Based Successive Cancellation List Decoding of Polar Codes; IEEE Transactions on Signal Processing, vol. 63, No. 19, Oct. 1, 2015, consisting of 15—pages.
Fangliao Yang et al.; Polar Codes for Soft Decode-and-Forward in Half Duplex Relay Channels; China Communications, China Institute of Communications; vol. 14, No. 8, Jul. 1, 2017, consisting of 11—pages.

* cited by examiner

METHOD FOR POLAR DECODING WITH DYNAMIC SUCCESSIVE CANCELLATION LIST SIZE AND POLAR DECODER

CROSS REFERENCE TO RELATED APPLICATION(S)

This application is a 35 U.S.C. § 371 National Phase Entry Application from PCT/CN2018/117716, filed Nov. 27, 2018, designating the United States, the disclosure of which is incorporated herein by reference in its entirety.

TECHNICAL FIELD

The present disclosure relates to information technology, and more particularly, to a method for polar decoding with dynamic Successive Cancellation List (SCL) size and a corresponding polar decoder.

BACKGROUND

Polar coding has attracted much attention since its birth in 2008 (see E. Arikan, "*Channel Polarization: A Method for Constructing Capacity-Achieving Codes for Symmetric Binary-Input Memoryless Channels,*" in IEEE Transactions on Information Theory, vol. 55, no. 7, pp. 3051-3073, July 2009). It can achieve Shannon capacity with very simple encoding and decoding. Recently, polar coding has been adopted by the 3$^{rd}$ Generation Partnership Project (3GPP) as a channel coding scheme for control channels in enhanced Mobile Broad Band (eMBB) services.

Figure 1:
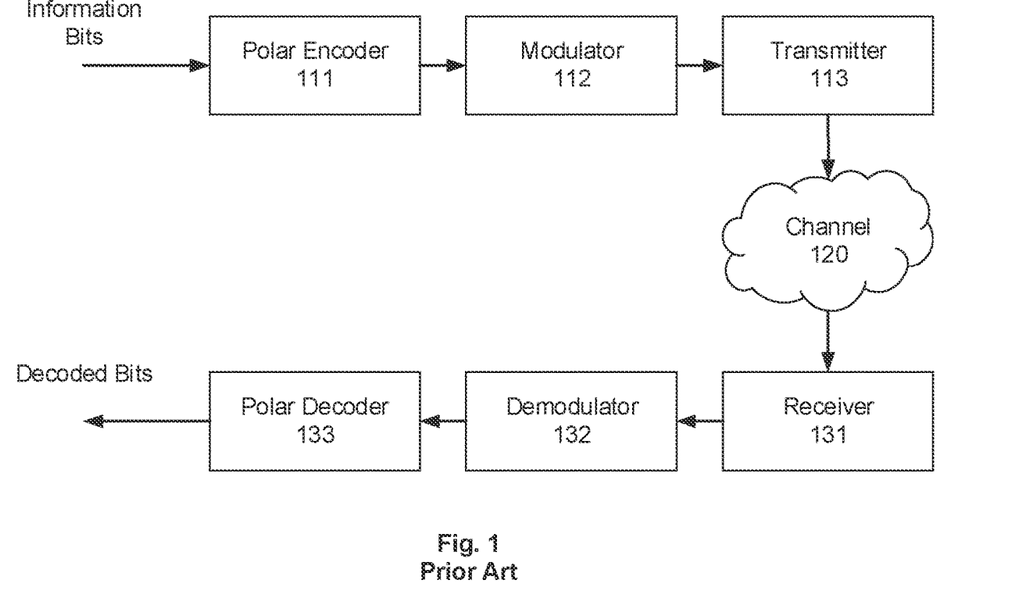
FIG. 1 is a schematic diagram showing a block diagram of a communication system with polar coding.

FIG. 1 shows a block diagram of a communication system with polar coding. As shown, information bits are inputted to a polar encoder 111, which adds frozen bits (typically 0s) and encodes the information bits and frozen bits into a codeword and sends the codeword to a modulator 112. The modulator 112 selects a digital or analog waveform for the codeword and sends the waveform to a transmitter 113. The transmitter 113 converts the waveform into a signal at a specific radio frequency for transmission to a receiver 131 via a channel 120, which can be modeled as an Additive White Gaussian Noise (AWGN) channel or a Binary Erasure Channel (BEC). The receiver 131 converts the received signal into a waveform by means of digitalization and sends the waveform to the demodulator 132. The demodulator 132 extracts a codeword from the waveform to generate a soft value and sends the soft value to a polar decoder 133. Then the polar decoder 133 corrects errors introduced during the transmission using a decoding scheme and outputs decoded bits. Typically, Cyclic Redundancy Check (CRC) can be used to check the correctness of the decoded bits.

There are mainly three decoding schemes for polar codes: Successive Cancellation (SC), Successive Cancellation List (SCL) and Belief Propagation (BP). Simulation results have demonstrated that the SCL scheme with CRC may have the best performance among the three decoding schemes.

Figure 2:
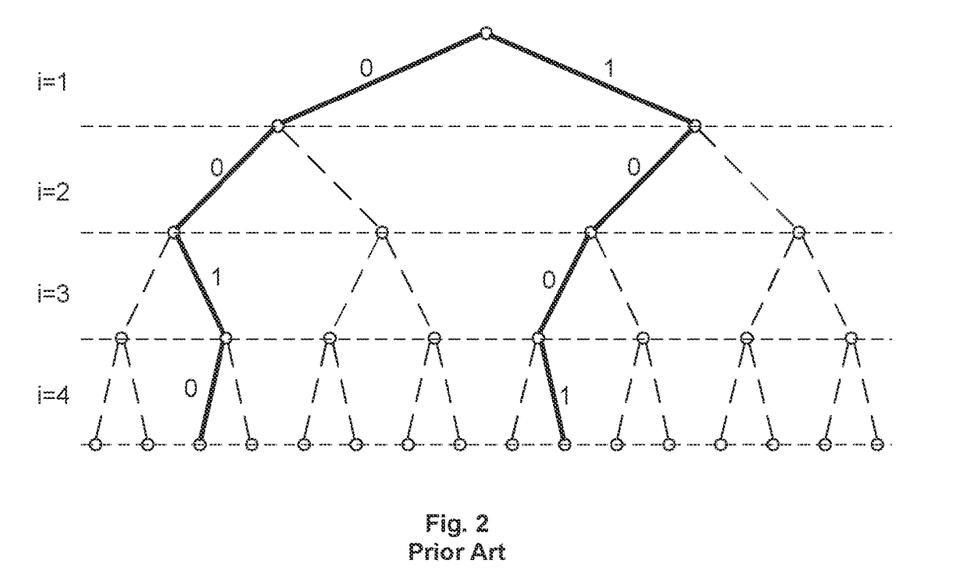
FIG. 2 is a schematic diagram showing a binary decoding tree for SCL decoding.

FIG. 2 shows a binary decoding tree for SCL decoding when the list size, L, is 2. Here, it is assumed that a signal representing N=4 bits is to be decoded. The decoding process starts with a root node at the top and, at each level i, i=1, 2, ..., N, of the tree, the left branch denotes the bit 0 and the right branch denotes the bit 1. At each level i, there are up to 2*L candidate paths and a Logarithmic Likelihood Ratio (LLR) for each candidate path can be calculated as:

$$LLR_i(l) \triangleq \log \frac{P_i(y, \hat{u}_1^{i-1}(l) \mid u_i = 0)}{P_i(y, \hat{u}_1^{i-1}(l) \mid u_i = 1)} \quad (1)$$

where l=1, 2, ..., 2*L is a candidate path index, y denotes a received real value, $\hat{u}_1^{i-1}(l)=[\hat{u}_1(l), \ldots, \hat{u}_{i-1}(l)]$ denotes the bits decided in the candidate path l from level 1 to level i−1 ($\hat{u}_0$ can be omitted), $u_i$ denotes the bit to be decided at level i, $P_i(y, \hat{u}_1^{i-1}(l)|u_i=0)$ and $P_i(y, \hat{u}_1^{i-1}(l)|u_i=1)$ denotes transition probabilities when $u_i=0$ and $u_i=1$, respectively.

At level i, a Path Metric (PM) can be calculated for each candidate path l based on the LLR as:

$$PM_i(l) \triangleq -\sum_{j=1}^{i} \ln\left(1 + e^{-(1-2\hat{u}_j(l)) \cdot LLR_j(l)}\right) \quad (2)$$

where $\hat{u}_j(l)=0$ or $\hat{u}_j(l)=1$, depending on l.

The list size L means that up to L candidate paths at each level i can survive for further processing at the next level i+1. Each PM value calculated in accordance with Equation (2) is a negative value. The larger the PM value of a candidate path is (the closer it is to zero), the more reliable the candidate path will be (the less error it may contain). In the context of the present disclosure, without loss of generality, a PM value is referred to as being "higher" or "larger" when it is closer to zero and indicates a more reliable path. At each level, up to L candidate paths having the highest PM values will be selected as survivors. Finally, among the candidate paths that survive at the last level, the one having the highest PM value will be selected (or when the CRC is applied, the one that can pass the CRC will be selected), as the decoded bit sequence. In the example, the solid lines in the decoding tree show the two candidate paths that survive at each level and one of the two final survivors, 0010 and 1001, will be selected as the decoded bit sequence, based on their CRC results or their PM values.

In general, an SCL decoder has a better performance with a larger list size, at expense of high complexity and higher time consumption. Therefore, it is desired to provide SCL decoder implementations having lower complexity and shorter running time. An adaptive SCL decoder with CRC is proposed in Li Bin, H. Shen, and D. Tse, "*An Adaptive Successive Cancellation List Decoder for Polar Codes with Cyclic Redundancy Check.*" IEEE Communications Letters 16.12(2012):2044-2047. The list size in this decoder is adaptive to the decoding process, which can achieve the same performance as the conventional SCL scheme but with lower complexity statistically. However, as it uses a brute-force searching method to figure out the minimum list size, it might have higher complexity and higher time consumption than the conventional SCL scheme in the worst case.

SUMMARY

It is an object of the present disclosure to provide a method for polar decoding with SCL and a corresponding polar decoder, capable of reducing complexity and running time of SCL decoding without substantially degrading the decoding performance.

According to a first aspect of the present disclosure, a method for polar decoding a received signal into a number, N, of bits with SCL is provided. The method includes: at the i-th level of a binary tree for decoding the i-th bit of the N bits, where $1 \leq i \leq N$: when the i-th bit is an information bit, calculating a path metric for each of $2*L_{i-1}$ candidate paths at the i-th level, where $L_{i-1}$ is an SCL size at the (i−1)-th level and $L_0=1$; and setting an SCL size at the i-th level, $L_i$, based on $L_{i-1}$ and a statistical distribution of the path metrics calculated for the $2*L_{i-1}$ candidate paths; and selecting $L_i$ surviving paths from the $2*L_{i-1}$ candidate paths based on their respective path metrics.

In an embodiment, the operation of setting $L_i$ may include: setting $L_i$ to be larger than $L_{i-1}$ when a difference between the largest and the smallest of the path metrics calculated for the $2*L_{i-1}$ candidate paths is smaller than a first predetermined threshold, setting $L_i$ to be equal to M when a difference between the largest and the smallest of the M+1 largest path metrics among the path metrics calculated for the $2*L_{i-1}$ candidate paths is larger than a second predetermined threshold, where $M<L_{i-1}$, and setting $L_i$ to be equal to $L_{i-1}$ otherwise.

In an embodiment, the operation of setting $L_i$ to be larger than $L_{i-1}$ may include setting $L_i=2*L_{i-1}$. The operation of setting $L_i$ to be equal to M may include setting $L_i=M=L_{i-1}/2$.

In an embodiment, $L_i$ can be set to be larger than $L_{i-1}$ only when $L_{i-1}$ is smaller than a maximum allowable value of SCL size, and/or $L_i$ can be set to be equal to M only when $L_{i-1}>1$.

In an embodiment, the first predetermined threshold may be smaller than the second predetermined threshold.

In an embodiment, the operation of calculating the path metric for each of $2*L_{i-1}$ candidate paths may include, for each of the $2*L_{i-1}$ candidate paths: calculating a Logarithmic Likelihood Ratio (LLR) and calculating the path metric based on the LLR.

In an embodiment, the method may further include: when the i-th bit is a frozen bit: setting $L_i$ to be equal to $L_{i-1}$; and determining $L_i$ surviving paths for the frozen bit.

In an embodiment, the method may further include: applying a Cyclic Redundancy Check, CRC to each of the $L_N$ surviving paths at the N-th level; and when only one of the LN surviving paths passes the CRC: determining N decoded bits from the one surviving path; when two or more of the LN surviving paths pass the CRC: determining N decoded bits from one of the two or more surviving paths that has the largest path metric among the two or more surviving paths; or when none of the LN surviving paths passes the CRC: determining N decoded bits from one of the LN surviving paths that has the largest path metric among the LN surviving paths.

In an embodiment, the method may further include: determining N decoded bits from one of the $L_N$ surviving paths that has the largest path metric.

According to a second aspect of the present disclosure, a polar decoder is provided. The polar decoder includes a processor and a memory. The memory contains instructions executable by the processor whereby the polar decoder is operative to perform the method according to the above first aspect.

According to a third aspect of the present disclosure, a computer readable storage medium is provided. The computer readable storage medium has computer program instructions stored thereon. The computer program instructions, when executed by a processor in a polar decoder, cause the polar decoder to perform the method according to the above first aspect.

With the embodiments of the present disclosure, the SCL size at each level can be adjusted dynamically based on a statistical distribution of path metrics for candidate paths. In this way, it is possible to reduce complexity and running time of SCL decoding without substantially degrading the decoding performance.

BRIEF DESCRIPTION OF THE DRAWINGS

The above and other objects, features and advantages will be more apparent from the following description of embodiments with reference to the figures, in which.

DETAILED DESCRIPTION

In the following, references in the specification to "one embodiment", "an embodiment", "an example embodiment" and the like indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It shall be understood that although the terms "first" and "second" etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed terms. The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components etc., but do not preclude the presence or addition of one or more other features, elements, components and/or combinations thereof.

In the following description and claims, unless defined otherwise, all technical and scientific terms used herein have the same meaning as commonly understood by one of ordinary skills in the art to which this disclosure belongs.

Figure 3:
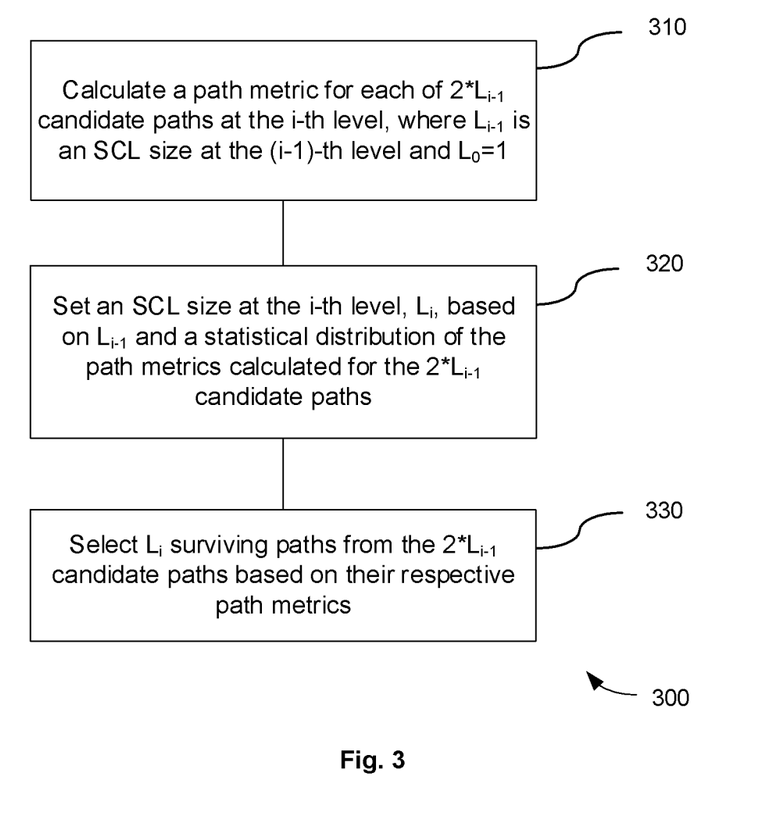
FIG. 3 is a flowchart illustrating a method for polar decoding with dynamic SCL size according to an embodiment of the present disclosure.

FIG. 3 is a flowchart illustrating a method 300 for polar decoding with dynamic SCL size according to an embodiment of the present disclosure. The method 300 can be performed at a polar decoder, e.g., the polar decoder 133 in FIG. 1, for decoding a received signal into a number, N, of bits. The method 300 can include the following blocks at the i-th level of a binary tree for decoding the i-th bit of the N bits, where $1 \leq i \leq N$.

When the i-th bit is an information bit, at block 310, a path metric for each of $2*L_{i-1}$ candidate paths at the i-th level is calculated, where $L_{i-1}$ is an SCL size at the (i−1)-th level and $L_0=1$. In the block 310, for each of the $2*L_{i-1}$ candidate paths, a Logarithmic Likelihood Ratio (LLR) can be calculated and the path metric can be calculated based on the LLR. For example, the LLR and the path metric can be calculated in accordance with Equations (1) and (2) as described above.

At block 320, an SCL size at the i-th level, $L_i$, is set based on $L_{i-1}$ and a statistical distribution of the path metrics calculated for the $2*L_{i-1}$ candidate paths.

In the block 320, when a difference (e.g., absolute difference) between the largest and the smallest of the path metrics calculated for the $2*L_{i-1}$ candidate paths is smaller than a first predetermined threshold, Th1, $L_i$ can be set to be larger than $L_{i-1}$. For example, let $PM_i(l)$, $l=1, 2, \ldots, 2*L_{i-1}$, denotes the path metrics calculated for the $2*L_{i-1}$ candidate paths. When the difference between the largest and the smallest of $PM_i(l)$ is sufficiently small (e.g., smaller than Th1), it means that these paths are so close that discarding even the worse candidate path would be risky. In this case, the SCL size can be increased. For example, all the $2*L_{i-1}$ candidate paths can be kept alive, i.e., $L_i=2*L_{i-1}$.

When a difference (e.g., absolute difference) between the largest and the smallest of the M+1 largest path metrics among the path metrics calculated for the $2*L_{i-1}$ candidate paths is larger than a second predetermined threshold, Th2, can be set to be equal to M, where $M<L_{i-1}$. That is, when the difference between the largest and the smallest of the M+1 largest path metrics is sufficiently large (e.g., larger than Th2), the $2*L_{i-1}-M$ worst candidate paths can be discarded as they are unlikely to be the correct path. In this case, the SCL size can be decreased. For example, $M=L_{i-1}/2$.

Otherwise, the SCL size may remain unchanged, i.e., $L_i=L_{i-1}$.

In an example, a maximum allowable value of SCL size $L_{max}$ is introduced. $L_i$ is set to be larger than $L_{i-1}$ only when $L_{i-1}<L_{max}$. On the other hand, $L_i$ is set to be smaller than $L_{i-1}$ (i.e., equal to M) only when $L_{i-1}>1$.

In an example, the first predetermined threshold Th1 can be smaller than the second predetermined threshold Th2, so as to avoid frequent changes in the SCL size. For example, Th1 and Th2 can be 4 and 6, respectively, for a BEC, or 10 and 15, respectively, for an AWGN.

At block 330, $L_i$ surviving paths are selected from the $2*L_{i-1}$ candidate paths based on their respective path metrics. For example, the $L_i$ candidate paths having the largest path metrics can be selected as the surviving paths.

Further, when the i-th bit is a frozen bit (e.g., 0), $L_i$ can be set to be equal to $L_{i-1}$ and $L_i$ surviving paths (e.g., each associated with bit 0) can be determined for the frozen bit.

In example, the method 300 may further include: applying a CRC to each of the $L_N$ surviving paths at the N-th level; and when only one of the LN surviving paths passes the CRC: determining N decoded bits from the one surviving path; when two or more of the LN surviving paths pass the CRC: determining N decoded bits from one of the two or more surviving paths that has the largest path metric among the two or more surviving paths; or when none of the LN surviving paths passes the CRC: determining N decoded bits from one of the LN surviving paths that has the largest path metric among the LN surviving paths.

Alternatively, the method 300 may further include: determining N decoded bits from one of the $L_N$ surviving paths that has the largest path metric, without applying a CRC.

Figure 4:
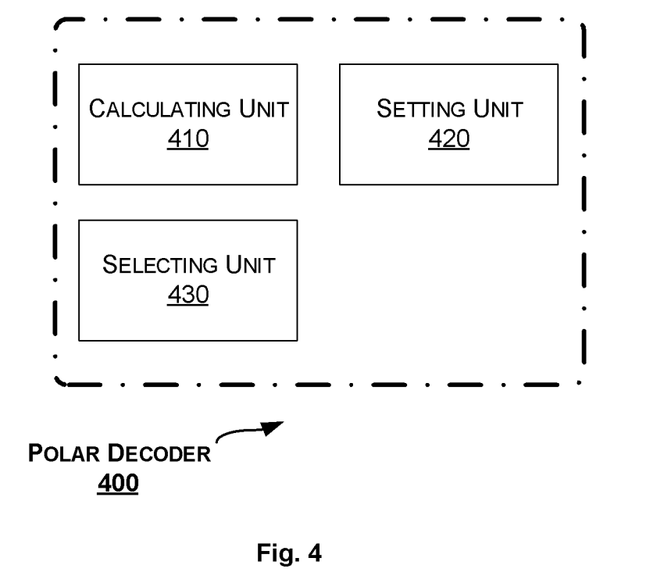
FIG. 4 is a block diagram of a polar decoder according to an embodiment of the present disclosure.

Correspondingly to the method 300 as described above, a polar decoder is provided. FIG. 4 is a block diagram of a polar decoder 400 according to an embodiment of the present disclosure.

As shown in FIG. 4, the polar decoder 400 includes, a calculating unit 410 configured to, at the i-th level of a binary tree for decoding the i-th bit of the N bits, where $1 \leq i \leq N$: when the i-th bit is an information bit, calculate a path metric for each of $2*L_{i-1}$ candidate paths at the i-th level, where $L_{i-1}$ is an SCL size at the (i−1)-th level and $L_0=1$. The polar decoder 400 further includes a setting unit 420 configured to set an SCL size at the i-th level, $L_i$, based on $L_{i-1}$ and a statistical distribution of the path metrics calculated for the $2*L_{i-1}$ candidate paths. The polar decoder 400 further includes a selecting unit 430 configured to select $L_i$ surviving paths from the $2*L_{i-1}$ candidate paths based on their respective path metrics.

In an embodiment, the setting unit 420 can be configured to: set $L_i$ to be larger than $L_{i-1}$ when a difference between the largest and the smallest of the path metrics calculated for the $2*L_{i-1}$ candidate paths is smaller than a first predetermined threshold, set $L_i$ to be equal to M when a difference between the largest and the smallest of the M+1 largest path metrics among the path metrics calculated for the $2*L_{i-1}$ candidate paths is larger than a second predetermined threshold, where $M<L_{i-1}$, and set $L_i$ to be equal to $L_{i-1}$ otherwise.

In an embodiment, the operation of setting $L_i$ to be larger than $L_{i-1}$ may include setting $L_i=2*L_{i-1}$. The operation of setting $L_i$ to be equal to M may include setting $L_i=M=L_{i-1}/2$.

In an embodiment, $L_i$ can be set to be larger than $L_{i-1}$ only when $L_{i-1}$ is smaller than a maximum allowable value of SCL size, Lmax, and/or $L_i$ can be set to be equal to M only when $L_{i-1}>1$.

In an embodiment, the first predetermined threshold may be smaller than the second predetermined threshold.

In an embodiment, the calculating unit 410 can be configured to, for each of the $2*L_{i-1}$ candidate paths: calculate a Logarithmic Likelihood Ratio (LLR) and calculate the path metric based on the LLR.

In an embodiment, when the i-th bit is a frozen bit, the setting unit 420 can be configured to set $L_i$ to be equal to $L_{i-1}$, and the selecting unit 430 can be configured to determine $L_i$ surviving paths for the frozen bit.

In an embodiment, the polar decoder 400 may further include a decoding unit configured to apply a CRC to each of the $L_N$ surviving paths at the N-th level; and when only one of the LN surviving paths passes the CRC: determine N decoded bits from the one surviving path; when two or more of the LN surviving paths pass the CRC: determine N decoded bits from one of the two or more surviving paths that has the largest path metric among the two or more surviving paths; or when none of the LN surviving paths passes the CRC: determine N decoded bits from one of the LN surviving paths that has the largest path metric among the LN surviving paths.

In an embodiment, the polar decoder 400 may further include a decoding unit configured to determine N decoded bits from one of the $L_N$ surviving paths that has the largest path metric.

The units 410~430 can be implemented as a pure hardware solution or as a combination of software and hardware, e.g., by one or more of: a processor or a micro-processor and adequate software and memory for storing of the software, a Programmable Logic Device (PLD) or other electronic component(s) or processing circuitry configured to perform the actions described above, and illustrated, e.g., in FIG. 3.

Figure 5:
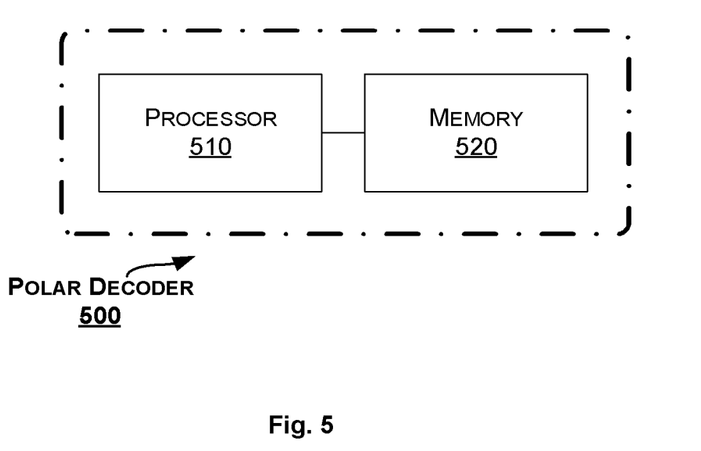
FIG. 5 is a block diagram of a polar decoder according to another embodiment of the present disclosure.

FIG. 5 is a block diagram of a polar coder 500 according to another embodiment of the present disclosure.

The polar coder 500 includes a processor 510 and a memory 520. The memory 520 contains instructions executable by the processor 510 whereby the polar coder 500 is operative to perform the actions, e.g., of the procedure described earlier in conjunction with FIG. 3. Particularly, the memory 520 contains instructions executable by the processor 510 whereby the polar coder 500 is operative to: at the i-th level of a binary tree for decoding the i-th bit of the N bits, where $1 \leq i \leq N$: when the i-th bit is an information bit, calculating a path metric for each of $2*L_{i-1}$ candidate paths at the i-th level, where $L_{i-1}$ is an SCL size at the (i−1)-th level and $L_0=1$; and setting an SCL size at the i-th level, $L_i$, based on $L_{i-1}$ and a statistical distribution of the path metrics calculated for the $2*L_{i-1}$ candidate paths; and selecting $L_i$ surviving paths from the $2*L_{i-1}$ candidate paths based on their respective path metrics.

In an embodiment, the operation of setting $L_i$ may include: setting $L_i$ to be larger than $L_{i-1}$ when a difference between the largest and the smallest of the path metrics calculated for the $2*L_{i-1}$ candidate paths is smaller than a first predetermined threshold, setting $L_i$ to be equal to M when a difference between the largest and the smallest of the M+1 largest path metrics among the path metrics calculated for the $2*L_{i-1}$ candidate paths is larger than a second predetermined threshold, where $M<L_{i-1}$, and setting $L_i$ to be equal to $L_{i-1}$ otherwise.

In an embodiment, the operation of setting $L_i$ to be larger than $L_{i-1}$ may include setting $L_i=2*L_{i-1}$. The operation of setting $L_i$ to be equal to M may include setting $L_i=M=L_{i-1}/2$.

In an embodiment, $L_i$ can be set to be larger than $L_{i-1}$ only when $L_{i-1}$ is smaller than a maximum allowable value of SCL size, and/or $L_i$ can be set to be equal to M only when $L_{i-1}>1$.

In an embodiment, the first predetermined threshold may be smaller than the second predetermined threshold.

In an embodiment, the operation of calculating the path metric for each of $2*L_{i-1}$ candidate paths may include, for each of the $2*L_{i-1}$ candidate paths: calculating a Logarithmic Likelihood Ratio (LLR) and calculating the path metric based on the LLR.

In an embodiment, the memory 520 may further contain instructions executable by the processor 510 whereby the polar coder 500 is operative to: when the i-th bit is a frozen bit: set $L_i$ to be equal to $L_{i-1}$; and determine $L_i$ surviving paths for the frozen bit.

In an embodiment, the memory 520 may further contain instructions executable by the processor 510 whereby the polar coder 500 is operative to: apply a CRC to each of the $L_N$ surviving paths at the N-th level; and when only one of the LN surviving paths passes the CRC: determine N decoded bits from the one surviving path; when two or more of the LN surviving paths pass the CRC: determine N decoded bits from one of the two or more surviving paths that has the largest path metric among the two or more surviving paths; or when none of the LN surviving paths passes the CRC: determine N decoded bits from one of the LN surviving paths that has the largest path metric among the LN surviving paths.

In an embodiment, the memory 520 may further contain instructions executable by the processor 510 whereby the polar coder 500 is operative to: determine N decoded bits from one of the $L_N$ surviving paths that has the largest path metric.

Figure 6:
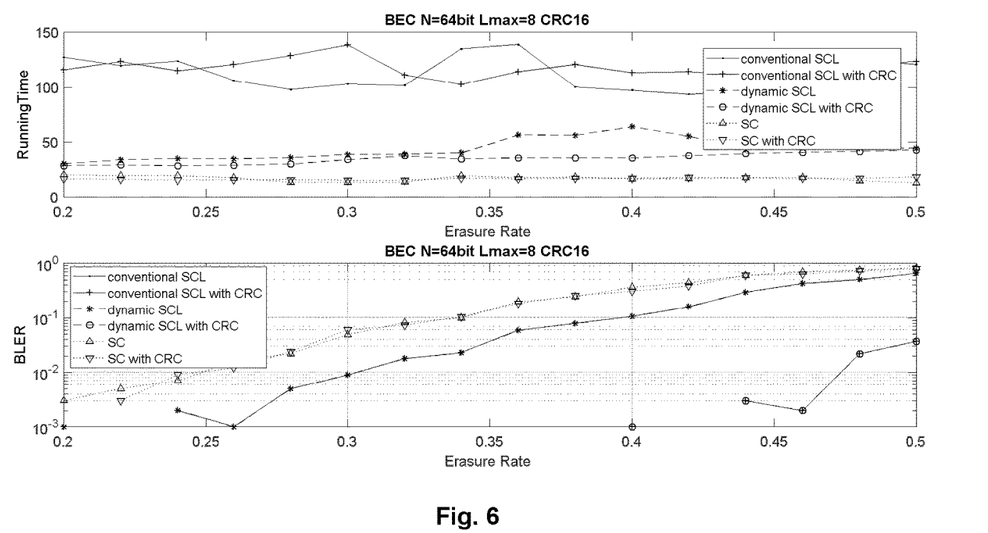
FIGS. 6-10 are schematic diagrams showing simulation results of polar decoding according to embodiments of the present disclosure, compared with some conventional polar decoding methods.
Figure 7:
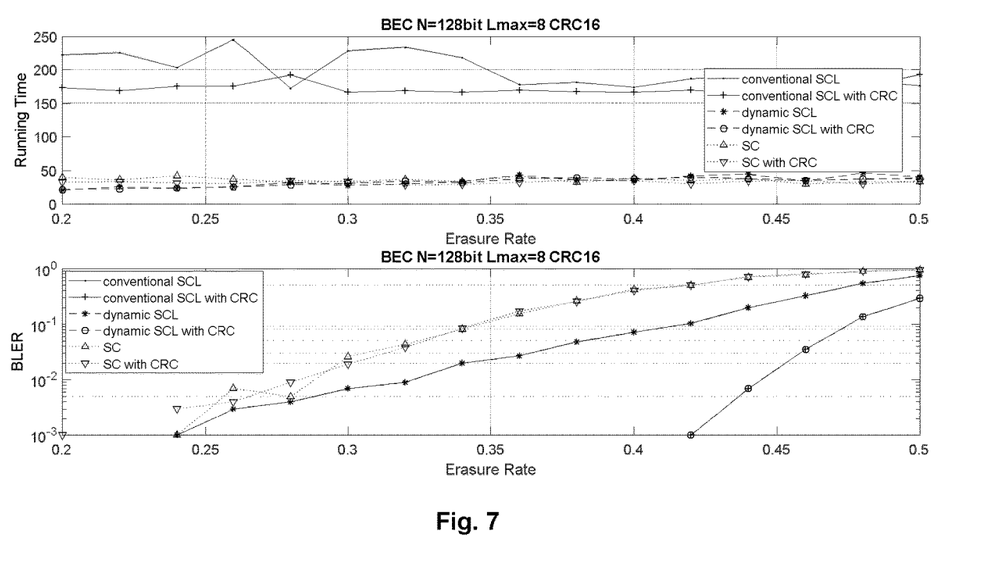
Figure 8:
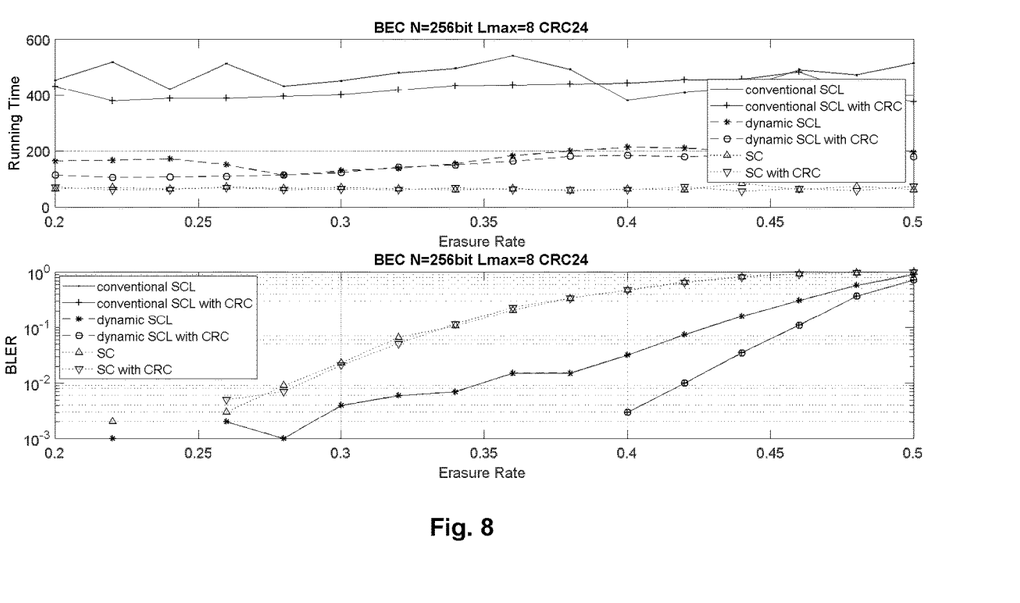

FIGS. 6-8 show simulation results of running time and Block Error Rate (BLER) versus erasure rates to decode 64-bit (N=64), 128-bit (N=128) and 256-bit (N=256) codewords (Code Rate=1/2) over BECs, respectively. It is assumed that Lmax=8, Th1=4 and Th2=6. It is further assumed that LLR of received bits to be $\{-1, 0, 1\}$, where 0 denotes an erasure while 1 and −1 correspond to received 0 and 1 separately. Six polar decoding schemes are simulated: conventional SCL (with fixed SCL size), conventional SCL with CRC, dynamic SCL according to the present disclosure, dynamic SCL according to the present disclosure with CRC, conventional SC, and conventional SC with CRC. As shown in each of FIGS. 6-8, the polar decoding schemes according to the present disclosure (i.e., dynamic SCL and dynamic SCL with CRC) can achieve substantially the same BLER performance as the conventional SCL and conventional SCL with CRC, while only consume less than ⅓ of the running time of the conventional SCL and conventional SCL with CRC. The running time of the dynamic SCL and dynamic SCL with CRC is close to that of the conventional SC and conventional SC with CRC, respectively.

Figure 9:
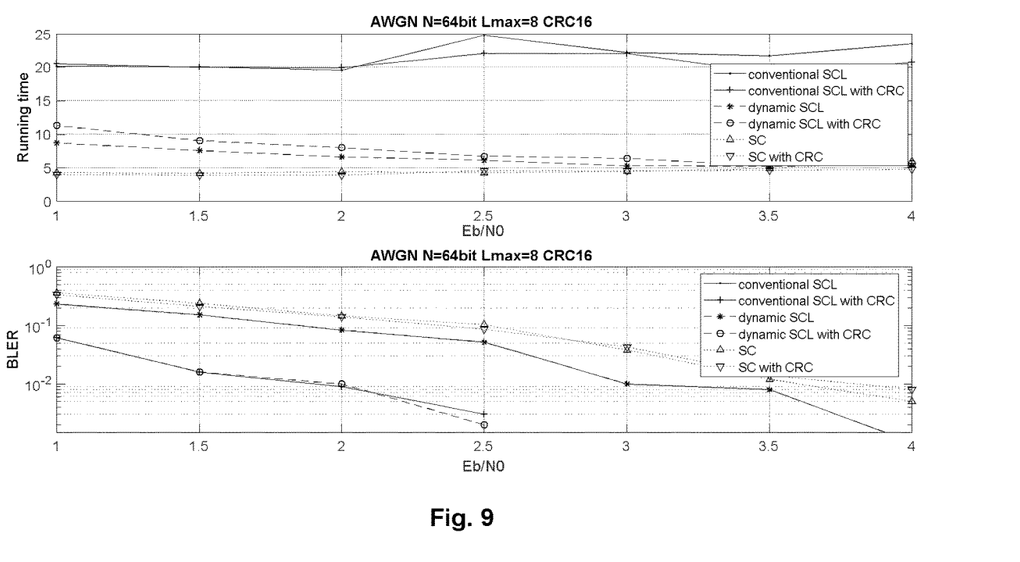
Figure 10:
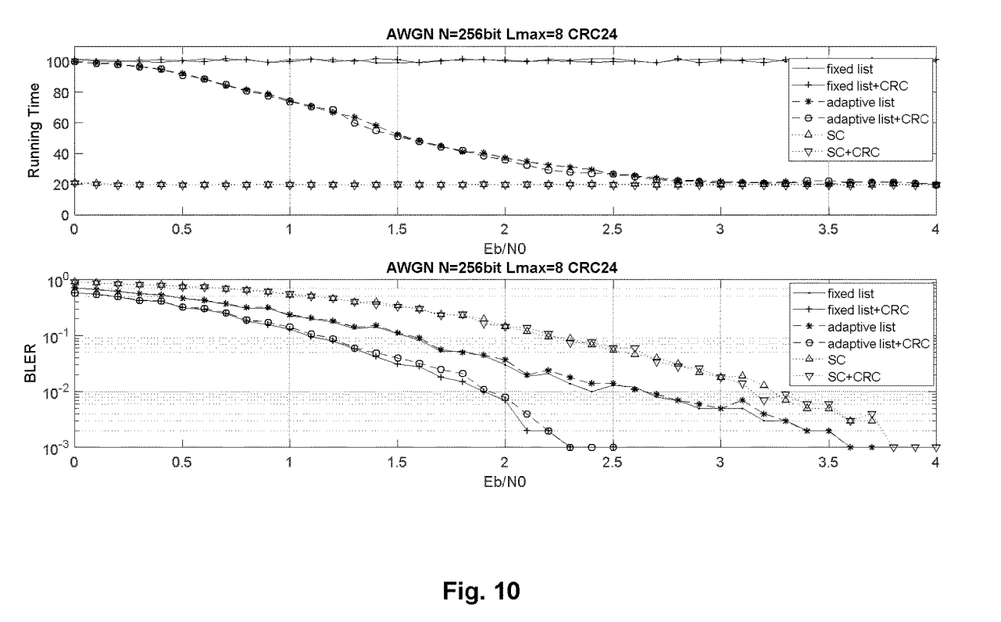

FIGS. 9-10 show simulation results of running time and BLER versus Eb/N0 to decode 64-bit (N=64) and 256-bit (N=256) codewords (Code Rate=1/2) over AWGN channels, respectively. It is assumed that Lmax=8, Th1=10 and Th2=15. Six polar decoding schemes are simulated: conventional SCL (with fixed SCL size), conventional SCL with CRC, dynamic SCL according to the present disclosure, dynamic SCL according to the present disclosure with CRC, conventional SC, and conventional SC with CRC. As shown in each of FIGS. 9-10, the polar decoding schemes according to the present disclosure (i.e., dynamic SCL and dynamic SCL with CRC) can achieve substantially the same BLER performance as the conventional SCL and conventional SCL with CRC, while only consume significantly less running time than the conventional SCL and conventional SCL with CRC. The running time of the dynamic SCL and dynamic SCL with CRC gets closer to that of the conventional SC and conventional SC with CRC, respectively, as the value of Eb/N0 increases.

The present disclosure also provides at least one computer program product in the form of a non-volatile or volatile memory, e.g., a non-transitory computer readable storage medium, an Electrically Erasable Programmable Read-Only Memory (EEPROM), a flash memory and a hard drive. The computer program product includes a computer program. The computer program includes: code/computer readable instructions, which when executed by the processor 510 causes the polar coder 500 to perform the actions, e.g., of the procedure described earlier in conjunction with FIG. 3.

The computer program product may be configured as a computer program code structured in computer program modules. The computer program modules could essentially perform the actions of the flow illustrated in FIG. 3.

The processor may be a single CPU (Central processing unit), but could also comprise two or more processing units. For example, the processor may include general purpose microprocessors; instruction set processors and/or related chips sets and/or special purpose microprocessors such as Application Specific Integrated Circuits (ASICs). The processor may also comprise board memory for caching purposes. The computer program may be carried by a computer program product connected to the processor. The computer program product may comprise a non-transitory computer readable storage medium on which the computer program is stored. For example, the computer program product may be a flash memory, a Random-access memory (RAM), a Read-Only Memory (ROM), or an EEPROM, and the computer program modules described above could in alternative embodiments be distributed on different computer program products in the form of memories.

The disclosure has been described above with reference to embodiments thereof. It should be understood that various modifications, alternations and additions can be made by those skilled in the art without departing from the spirits and scope of the disclosure. Therefore, the scope of the disclosure is not limited to the above particular embodiments but only defined by the claims as attached.

The invention claimed is:

1. A method performed by a polar decoder for polar decoding the method comprising:
receiving, from a demodulator, a demodulated radio signal; and
decoding the demodulated radio signal into a number, N, of bits with Successive Cancellation List by:
determining, by a processor of the polar decoder, at the i-th level of a binary tree for decoding the i-th bit of the N bits, where $1 \leq i \leq N$, and when the i-th bit is an information bit by:
calculating, by the processor, a path metric for each of $2*L_{i-1}$ candidate paths at the i-th level, where $L_{i-1}$ is an SCL size at the (i−1)-th level and $L_0=1$, the calculating the path metric for each of $2*L_{i-1}$ candidate paths comprises, for each of the $2*L_{i-1}$ candidate paths: calculating a Logarithmic Likelihood Ratio, LLR, and calculating, by the processor, the path metric based on the LLR;
setting, by the processor, an SCL size at the i-th level, $L_i$, based on and a statistical distribution of the path metrics calculated for the $2*L_{i-1}$ candidate paths; and
selecting, by the processor, $L_i$ surviving paths from the $2*L_{i-1}$ candidate paths based on their respective path metrics;
determining a difference between the largest and the smallest of the path metrics calculated for the $2*L_{i-1}$ candidate paths, and dynamically setting $L_i$ based on the difference; and
when the i-th bit is a frozen bit:
setting, by the processor, $L_i$ to be equal to $L_{i-1}$ and determining Li surviving paths for the frozen bit.

2. The method of claim 1, wherein said setting $L_i$ comprises:
setting $L_i$ to be larger than $L_{i-1}$ when the difference between the largest and the smallest of the path metrics calculated for the $2*L_{i-1}$ candidate paths is smaller than a first predetermined threshold,
setting $L_i$ to be equal to M when a difference between the largest and the smallest of the M+1 largest path metrics among the path metrics calculated for the $2*L_{i-1}$ candidate paths is larger than a second predetermined threshold, where $M<L_{i-1}$, and
setting $L_i$ to be equal to $L_{i-1}$ otherwise.

3. The method of claim 2, wherein
setting $L_i$ to be larger than $L_{i-1}$ comprises setting $L_i=2*L_{i-1}$; and/or
setting $L_i$ to be equal to M comprises setting $L_i=M=L_{i-1}/2$.

4. The method of claim 2, wherein $L_i$ is set to be larger than $L_{i-1}$ only when $L_{i-1}$ is smaller than a maximum allowable value of SCL size, and/or $L_i$ is set to be equal to M only when $L_{i-1}>1$.

5. The method of claim 2, wherein the first predetermined threshold is smaller than the second predetermined threshold.

6. The method of claim 1, further comprising:
applying a Cyclic Redundancy Check, CRC, to each of the LN surviving paths at the N-th level; and
when only one of the $L_N$ surviving paths passes the CRC:
determining N decoded bits from the one surviving path;
when two or more of the $L_N$ surviving paths pass the CRC:
determining N decoded bits from one of the two or more surviving paths that has the largest path metric among the two or more surviving paths; or
when none of the $L_N$ surviving paths passes the CRC:
determining N decoded bits from one of the $L_N$ surviving paths that has the largest path metric among the $L_N$ surviving paths.

7. The method of claim 1, further comprising:
determining N decoded bits from one of the $L_N$ surviving paths that has the largest path metric.

8. A polar decoder comprising:
a processor; and
memory, the memory including instructions executable by the processor whereby the polar decoder is configured to perform a method for polar decoding a demodulated radio signal received from a demodulator into a number, N, of bits with Successive Cancellation List, SCL by:
determining at the i-th level of a binary tree for decoding the i-th bit of the N bits, where $1 \leq i \leq N$, and when the i-th bit is an information bit by:
calculating a path metric for each of $2*L_{i-1}$ candidate paths at the i-th level, where $L_{i-1}$ is an SCL size at the (i−1)-th level and $L_0=1$, the calculating the path metric for each of $2*L_{i-1}$ candidate paths comprises, for each of the $2*L_{i-1}$ candidate paths: calculating a Logarithmic Likelihood Ratio, LLR, and calculating the path metric based on the LLR;
setting an SCL size at the i-th level, $L_i$, based on $L_{i-1}$ and a statistical distribution of the path metrics calculated for the $2*L_{i-1}$ candidate paths; and
selecting $L_i$ surviving paths from the $2*L_{i-1}$ candidate paths based on their respective path metrics;
determining a difference between the largest and the smallest of the path metrics calculated for the $2*L_{i-1}$ candidate paths, and dynamically setting $L_i$ based on the difference; and
when the i-th bit is a frozen bit:
setting $L_i$ to be equal to $L_{i-1}$ and determining Li surviving paths for the frozen bit.

9. A computer program product comprising a non-transitory computer readable storage medium having computer program instructions stored thereon, the computer program instructions comprising:
when executed by a processor in a polar decoder, causing the polar decoder to perform a method for polar decoding a demodulated radio signal received from a demodulator into a number, N, of bits with Successive Cancellation List, SCL, the method including:
determining at the i-th level of a binary tree for decoding the i-th bit of the N bits, where $1 \leq i \leq N$, and when the i-th bit is an information bit by:

calculating a path metric for each of $2*L_{i-1}$ candidate paths at the i-th level, where $L_{i-1}$ is an SCL size at the (i−1)-th level and $L_0=1$, the calculating the path metric for each of $2*L_{i-1}$ candidate paths comprises, for each of the $2*L_{i-1}$ candidate paths: calculating a Logarithmic Likelihood Ratio, LLR, and calculating the path metric based on the LLR;

setting an SCL size at the i-th level, $L_i$, based on $L_{i-1}$ and a statistical distribution of the path metrics calculated for the $2*L_{i-1}$ candidate paths; and selecting $L_i$ surviving paths from the $2*L_{i-1}$ candidate paths based on their respective path metrics;

determining a difference between the largest and the smallest of the path metrics calculated for the $2*L_{i-1}$ candidate paths, and dynamically setting $L_i$ based on the difference; and when the i-th bit is a frozen bit:
  setting $L_i$ to be equal to $L_{i-1}$ and determining Li surviving paths for the frozen bit.

* * * * *